United States Patent [19]

Moriya

[11] Patent Number: 5,578,129
[45] Date of Patent: Nov. 26, 1996

[54] GAS SUPPLYING HEAD AND LOAD LOCK CHAMBER OF SEMICONDUCTOR PROCESSING SYSTEM

[75] Inventor: Shuji Moriya, Yamanashi-ken, Japan

[73] Assignee: Tokyo Electron Limited, Tokyo, Japan

[21] Appl. No.: 516,361

[22] Filed: Aug. 17, 1995

Related U.S. Application Data

[63] Continuation-in-part of Ser. No. 214,282, Mar. 17, 1994, Pat. No. 5,494,522.

[30] Foreign Application Priority Data

Mar. 17, 1993 [JP] Japan .................. 5-56939
Aug. 17, 1994 [JP] Japan .................. 6-215299

[51] Int. Cl.⁶ .................................................. C23C 16/00
[52] U.S. Cl. .............. 118/719; 118/723 E; 118/723 MP; 204/298.07
[58] Field of Search ..................... 156/345; 118/723 E, 118/723 ER, 723 MP, 719; 204/298.07, 298.33, 298.25, 298.35

[56] References Cited

U.S. PATENT DOCUMENTS

| | | | |
|---|---|---|---|
| 5,304,250 | 4/1994 | Sameshima et al. | 118/723 E |
| 5,324,360 | 6/1994 | Kozuka | 118/719 |
| 5,342,471 | 8/1994 | Fukasawa et al. | 156/345 |
| 5,385,624 | 1/1995 | Amemiya et al. | 156/345 |
| 5,425,842 | 6/1995 | Zijlstra | 156/643 |
| 5,500,256 | 3/1996 | Watabe | 427/579 |
| 5,522,933 | 6/1996 | Geller et al. | 118/723 E |

FOREIGN PATENT DOCUMENTS

WO8707310 12/1987 WIPO .................. 118/723

*Primary Examiner*—R. Bruce Breneman
*Assistant Examiner*—Joni Y. Chang
*Attorney, Agent, or Firm*—Oblon, Spivak, McClelland, Maier & Neustadt, P.C.

[57] ABSTRACT

An etching system for processing a semiconductor wafer has a processing chamber and a load lock chamber. The load lock chamber includes an airtight casing having openings through which the wafer is transferred, and each of the openings is openably and airtightly closed by a gate valve. A transfer arm for carrying the wafer is provided within the casing. A gas supplying system for supplying an inert gas and an exhausting system are connected to the casing. A gas supplying head is connected to the inner end of the gas supplying system, and has an outlet filter which is made of a porous ceramic plate formed into a cylinder. The porous ceramic plate has a multi-layer structure consisting of supporting, intermediate and filtering layers. The average pore diameter of the filtering layer is from 0.8 μm to 0.1 μm, and the porosity thereof is from 10% to 50%.

21 Claims, 6 Drawing Sheets

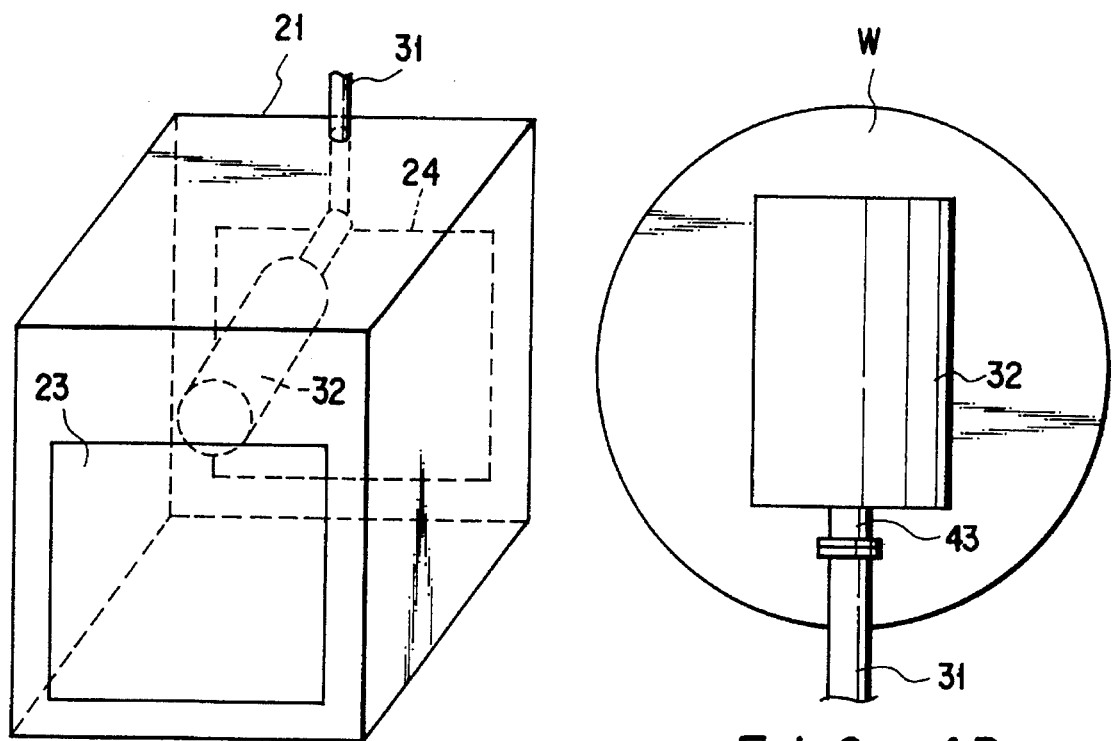
FIG. 4A
FIG. 4B
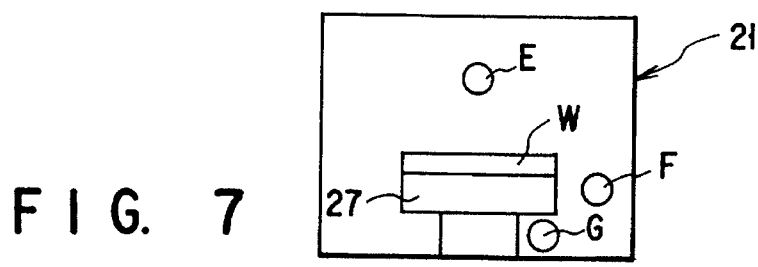
FIG. 7
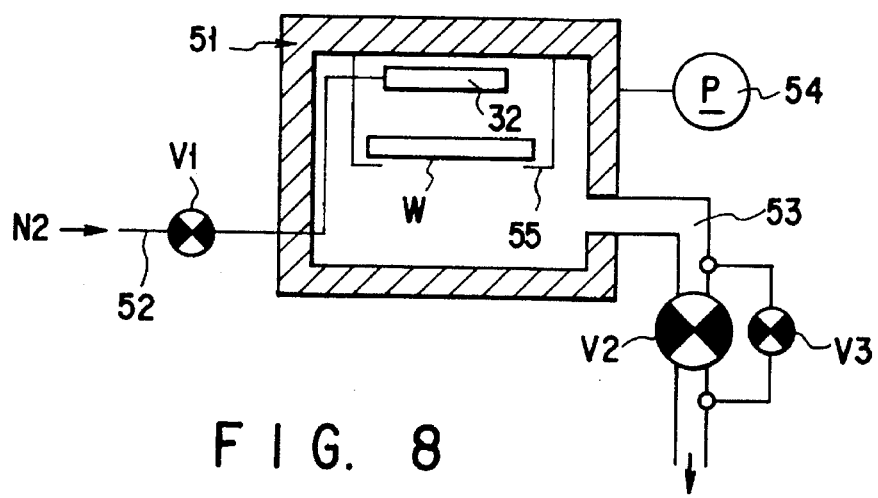
FIG. 8

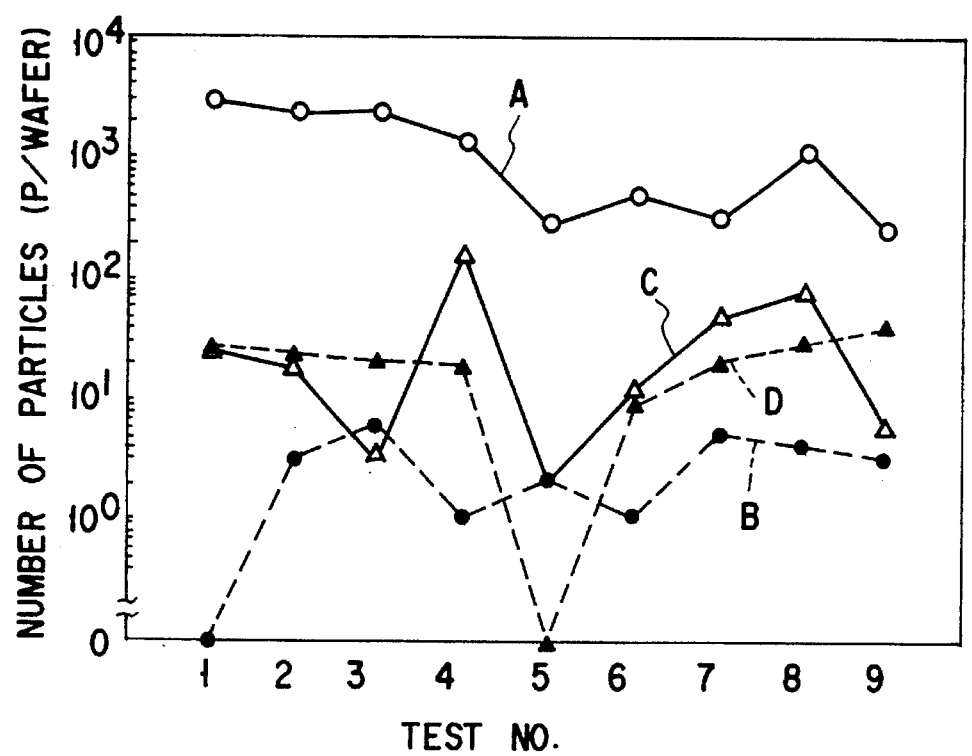
F I G. 5
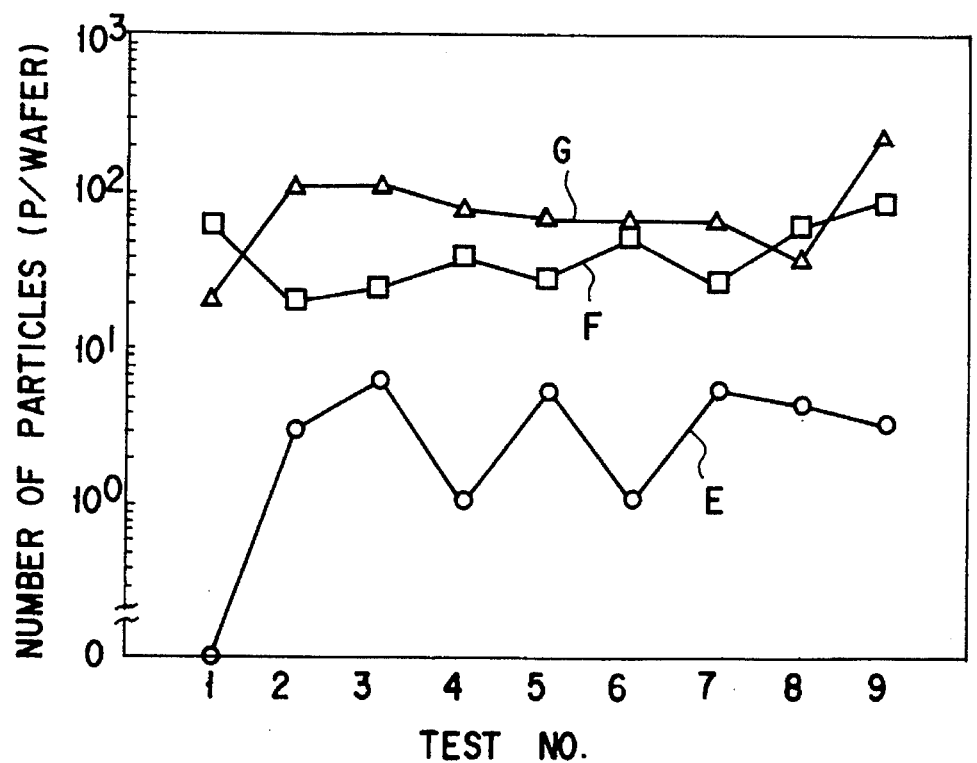
F I G. 6

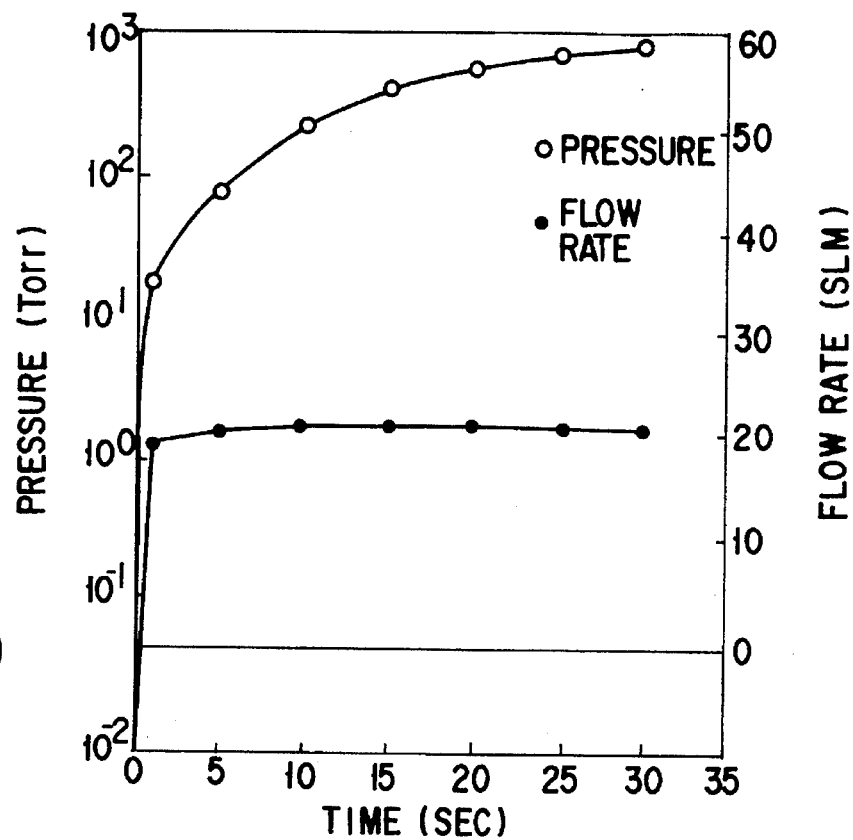
F I G. 9
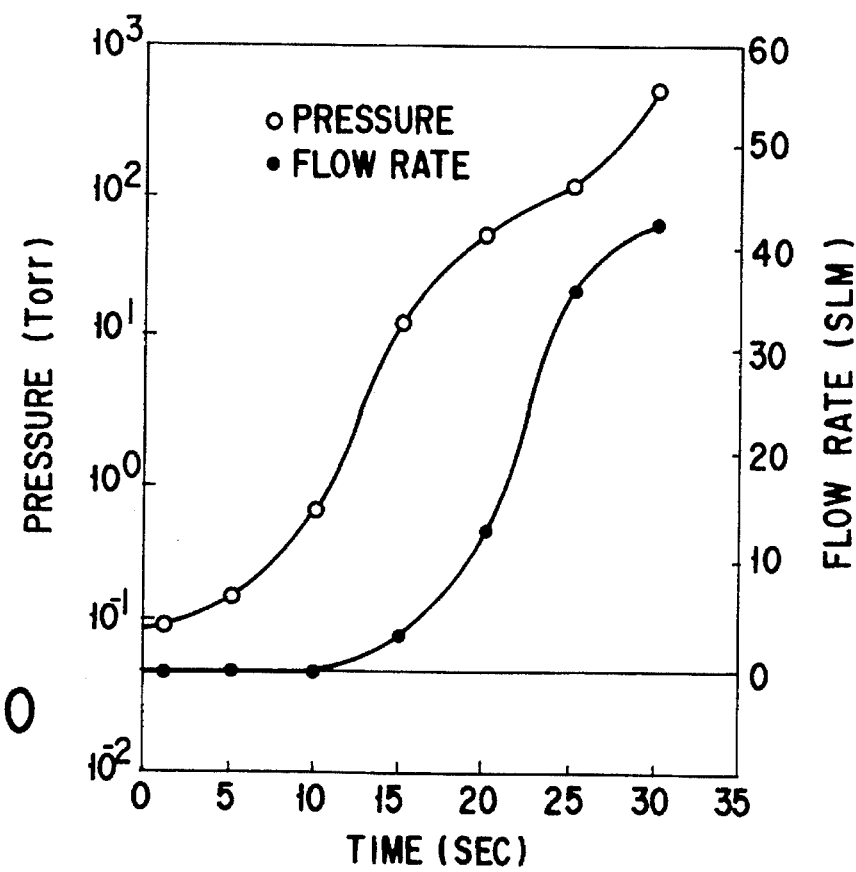
F I G. 10

GAS SUPPLYING HEAD AND LOAD LOCK CHAMBER OF SEMICONDUCTOR PROCESSING SYSTEM

CROSS-REFERENCE TO THE RELATED APPLICATIONS

This application is a continuation-in-part of U.S. patent application Ser. No. 08/214,282, filed Mar. 17, 1994, now U.S. Pat. No. 5,494,522.

BACKGROUND OF THE INVENTION

1. Field of the Invention

The present invention relates to a gas supplying head for use in a system for processing a substrate to be processed, such as a semiconductor wafer or an LCD substrate, and also to a load lock chamber using the gas supplying head. In particular, the invention relates to a gas supplying head for preventing particles from adhering to the substrate in a reduced-pressure atmosphere, and a load lock chamber using the gas supplying head.

2. Description of the Related Art

In general, a semiconductor processing system includes a processing chamber and a load lock camber (preliminary chamber) connected to the processing chamber by a gate. In the processing system, various kinds of processing gases are used, and a process is performed on a substrate such as a semiconductor wafer or an LCD substrate under a reduced-pressure. The load lock chamber generally is provided with an inert gas supplying system and an exhausting system which are connected thereto. The inner pressure of the load lock chamber can be adjusted independently of that of the processing chamber. The semiconductor processing system may have two load lock chambers, one for holding a wafer W to be processed and the other for holding a wafer W processed.

In general, a semiconductor wafer is processed as follows:

The semiconductor wafer is transferred into the load lock chamber. The gas within the load lock chamber is exhausted and replaced with a gas such that the load lock chamber has a reduced-pressure atmosphere which is substantially the same as that of the processing chamber. Then, the gate is opened, and the wafer is transferred from the load lock chamber into the processing chamber. Sequentially, the gate is closed, and the wafer is processed in the processing chamber.

After the wafer is processed, the gate is opened, and the wafer is returned to the load lock chamber. Then, the gate is closed, and the gas within the load lock chamber is exhausted and replaced with air or an inert gas, e.g. a nitrogen gas. Sequentially, the wafer is moved our of the load lock chamber.

As the inert gas or air is introduced into the load lock chamber, particles may be adhered to the surface of the wafer for two reasons. First, the gas or air introduced into the load lock chamber makes fine particles therein fly upward. Second, the introduced gas or air includes fine particles, e.g. dust.

Known as a general method for preventing particles from flying upward is a so-called "slow vent method". In the slow vent method, the valve is gradually opened so as to restrict increase of the flow velocity of gas. However, in the load lock chamber, particles fly upward the moment the valve is opened in a reduced-pressure state, in particular a greatly reduced-pressure state, even if opening of the valve is carefully adjusted. This is because at the above moment, a gas stream generates due to rapid variation of the inner pressure of the chamber, and makes the particles fly upward. Furthermore, it is impossible to prevent fine particles included in the gas from entering the chamber.

SUMMARY OF THE INVENTION

Therefore, the object of the present invention is to provide a gas supplying head for preventing particles from adhering to a surface to be processed, of a substrate, and a load lock chamber using the gas supplying head.

According to a first aspect of the present invention, there is provided a gas supplying head for supplying a gas for use in pressure adjustment into an airtight casing of a semiconductor processing system while a substrate to be processed is supported within an inside of the casing, the gas supplying head comprising:

a gas storing section which communicates with a gas introduction pipe for introducing the gas into the casing; and an outlet filter comprising a porous filtering layer having a number of pores through which the gas storing section communicates with the inside of the casing, the pores having a average diameter of from 0.8 µm to 0.1 µm, the filtering layer having porosity of from 10% to 50%.

According to a second aspect of the present invention, there is provided a load lock chamber of a semiconductor processing system for processing a substrate, comprising:

an airtight casing which has an opening for allowing the substrate to pass therethrough;

closing means for openably and airtightly closing the opening;

supporting means for supporting the substrate within an inside of the casing;

a gas introduction pipe for introducing a gas for use in pressure adjustment into the casing;

an exhausting system for exhausting the casing; and a gas supplying head connected to the gas introduction pipe, for supplying the gas introduced from the gas introduction pipe into the casing while the substrate is supported by the supporting means, wherein the gas supplying head comprises a gas storing section communicating with the gas introduction pipe, and an outlet filter comprising a porous filtering layer having a number of pores through which the gas storing section communicates with the inside of the casing, the pores having a average diameter of from 0.8 µm to 0.1 µm, the filtering layer having porosity of from 10% to 50%.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4A is a schematic perspective view showing arrangement of the gas supplying head, shown in FIG. 1, in the load lock chamber, and FIG. 4B is a plan view showing the positional relationship between the wafer and the gas supplying head;

FIG. 5 is a graph showing the effects which the gas supplying head shown in FIG. 1 has, using the load lock chamber;

FIG. 6 is a graph showing the relationships between the effects and locations of the gas supplying head;

FIG. 7 is a view showing the locations of the gas supplying heads in an experiment the result of which is shown FIG. 6;

FIG. 8 is a view showing a load lock chamber according to another embodiment of the present invention;

FIG. 9 is a graph showing the relationship between the inner pressure and the gas flow rate of the load lock chamber shown in FIG. 8 in an experiment carried out by use of the load lock chamber;

FIG. 10 is a graph showing the relationship between the inner pressure and the gas flow rate of the load lock chamber shown in FIG. 8 in another experiment carried out by use of the load lock chamber;

DETAILED DESCRIPTION OF THE PREFERRED EMBODIMENTS

Figure 1:
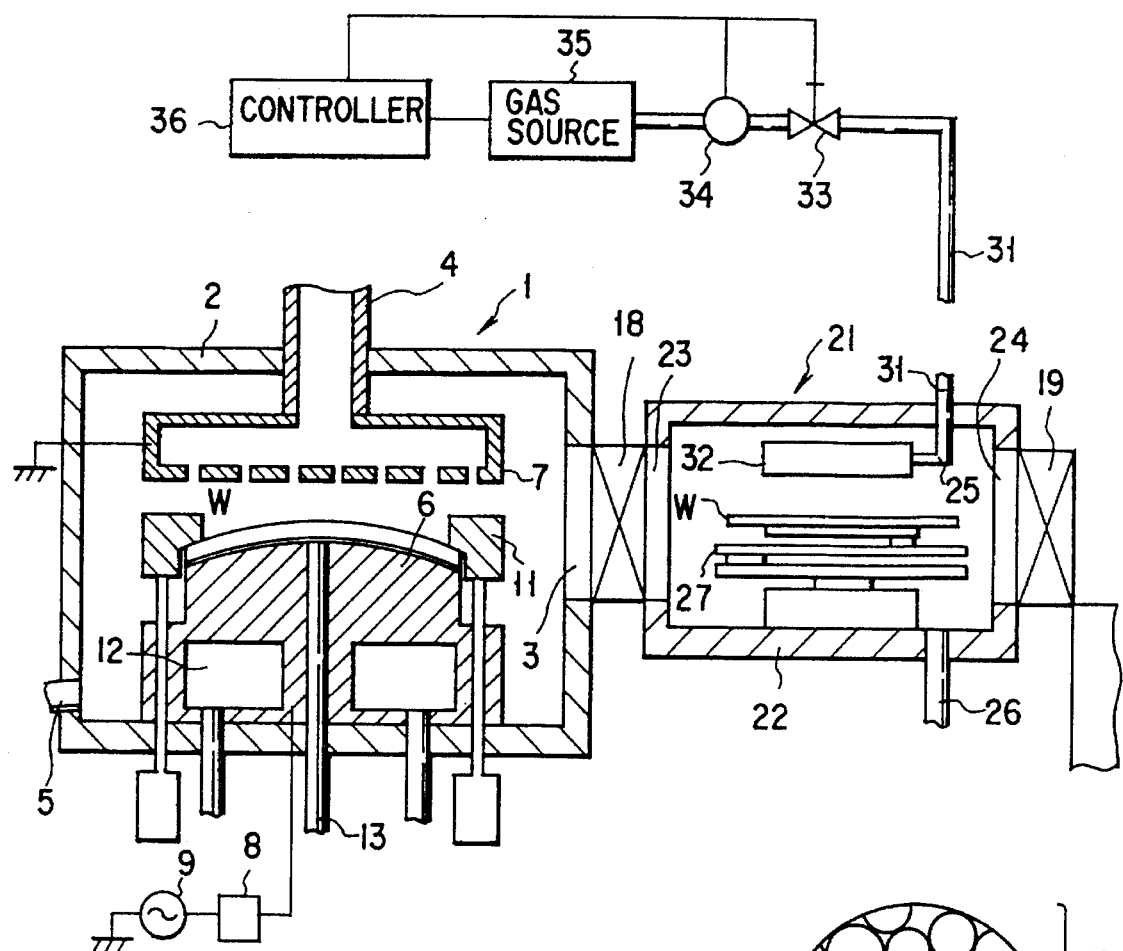
FIG. 1 is a schematic view showing an etching system for etching a semiconductor wafer and employing a load lock chamber according to one embodiment of the present invention.

FIG. 1 is a schematic view showing an etching system for etching a semiconductor wafer and employing a load lock chamber according to one embodiment of the present invention. The etching system shown in FIG. 1 has a processing chamber 1 and a load lock chamber 21 serving as a preliminary chamber through which a wafer is transferred into and out of the system. The processing chamber 1 includes an airtight casing 2 having an opening 3, and the load lock chamber 21 includes an airtight casing 22 having two openings 23 and 24 which are opposite to each other. The opening 3 of the processing chamber 1 and the opening 23 of the load lock chamber 21 are airtightly connected to each other by a gate valve 18. The opening 24 of the load lock chamber 21 is airtightly connected, by a gate valve 19, to an in/out section, e.g. a table on which a cassette for containing a plurality of wafers is placed.

A reaction gas supplying system 4 is connected to an upper portion of the processing chamber 1, and an exhausting system is connected to a lower portion of the processing chamber 1. In the processing chamber 1, there are provided a susceptor 6 serving as a table and a lower electrode, and a shower electrode 7 serving as an upper electrode opposite to the lower electrode and a shower head of the reaction gas supplying system 4. The susceptor 6 is connected to a high-frequency power supply 9 through a matching circuit 8, while the shower electrode 7 is grounded. A clamp 11 for fixing a wafer W to the susceptor 6 is provided in the vicinity of the susceptor 6, and movable upward and downward. In the susceptor 6, there are provided a cooling jacket 12 for cooling the susceptor 6 due to introduction of a refrigerant, and a line 13 for supplying a heat transmission gas to a gap between the susceptor 6 and the wafer W.

A gas supplying system 25 for supplying a gas, such as an inert gas, e.g. nitrogen, or clean air for use in pressure adjustment and gas replacement, is connected to an upper portion of the load lock chamber 21, and an exhausting system 26 is connected to a lower portion of the load lock chamber 21. Therefore, in the load lock chamber 21, the inner pressure thereof can be independently adjusted. Further, a transfer arm 27 for carrying a wafer W through the openings 23 and 24 is arranged in a central region of the load lock chamber 21.

The gas supplying system 25 of the load lock chamber 21 has a gas introduction pipe 31 airtightly penetrating the casing 22 and connected to a gas source 35. A gas supplying head 32 is connected to an end of the introduction pipe 31. The introduction pipe 31 is connected to the gas source 35 for supplying an inert gas such as nitrogen or a gas such as air, through a regulator 33 and a valve 34. The regulator 33, the valve 34 and the gas source 35 are controlled by a controller 36.

One example of a wafer etching process using the etching system shown in FIG. 1 will be explained.

First of all, the gate valve 19 of the load lock chamber 21 is opened to make the load lock chamber 21 communicate with the in/out section, and a wafer W (a substrate to be processed) is transferred into the load lock chamber 21. Then, the gate valve 19 is closed to keep the load lock chamber airtight, and the load lock chamber 21 is exhausted by the exhausting system 26, thereby decreasing the inner pressure of the load lock chamber 21 (an exhausting step). Thereafter, an atmosphere gas which is the same as that in the processing chamber 1 is supplied from the gas supplying head 32 into the load lock chamber 21. In other words, in the load lock chamber 21, the inside gas is replaced with the atmosphere gas identical to that of the processing chamber 1 (a first gas-introduction step).

The first gas-introduction step and the exhausting step can be executed at the same time. Further, the exhausting system does not need to have forcedly-exhausting means. In this case, the load lock chamber 21 is spontaneously exhausted by introducing a gas for use in gas replacement thereinto, thereby attaining gas replacement.

Next, the gate valve 18 is opened to make the load lock chamber 21 and the processing chamber 1 communicate with each other. The wafer W is transferred into the processing chamber 1, loaded on the susceptor 6, and fixed thereto by the clamp 11. Then, the gate valve 18 is closed to airtightly isolate the load lock chamber 21 and the processing chamber 1 from each other. Further, an etching gas, e.g. a chlorine-based gas is supplied from the reaction gas supplying system 4 into the processing chamber 1, and a high-frequency voltage is applied between the upper and lower electrodes 6 and 7, thereby making the etching gas into plasma. The wafer W is etched by use of the plasma.

After the wafer W is etched, the gate valve 18 is opened, whereby the load lock chamber 21 communicates with the processing chamber 1. The wafer W is transferred into the load lock chamber 21, and simultaneously, part of the atmosphere gas is moved into the load lock chamber 21. Then, the gate valve 18 is closed, thereby airtightly isolating the load lock chamber 21 from the processing chamber 1.

Further, the load lock chamber 21 is exhausted by the exhausting system 26, thereby decreasing the inner pressure of the load lock chamber 21. A gas such as an inert gas is supplied from the gas supplying head 32 into the load lock chamber 21 while the load lock chamber 21 is exhausted, thereby replacing gas therein with an inert gas (a second gas introduction step). Then, the gate valve is opened to make the load lock chamber 21 communicate with the in/out section, and the wafer W is moved out of the load lock chamber 21.

Figure 3:
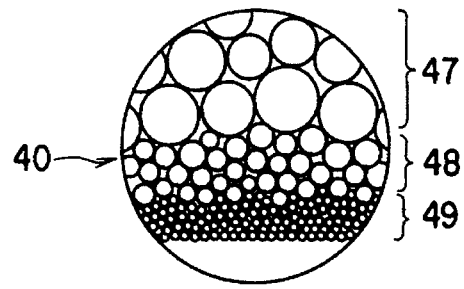
FIG. 3 is an enlarged cross-sectional view showing a porous plate constituting the outlet filter of the gas supplying head shown in FIG. 1.
Figure 2:
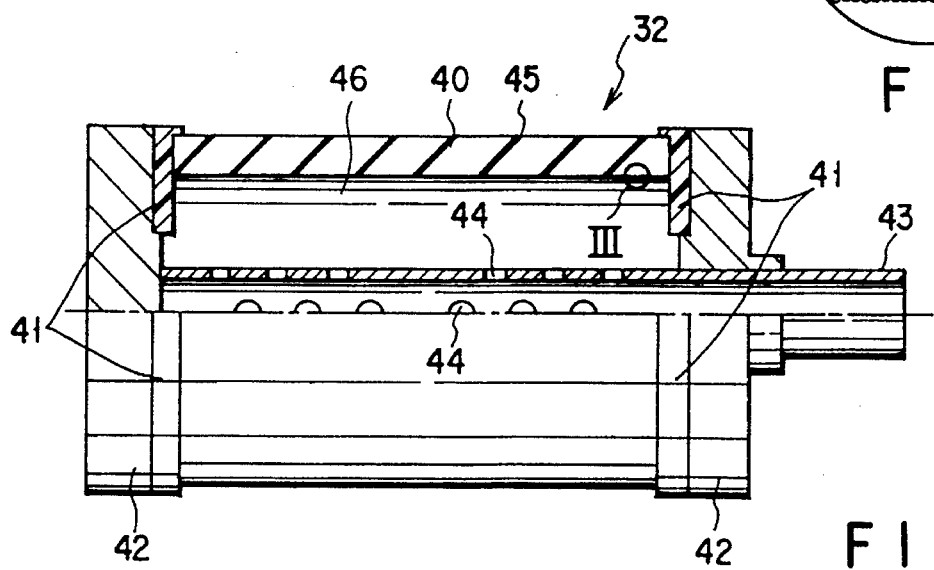
FIG. 2 is an enlarged partially-cutaway view of a gas supplying head shown in FIG. 1.

As shown in FIG. 2, the gas supplying head 32 includes an outlet filter 40 formed into a hollow cylinder 45 having an outer diameter of about 19 mm and a length of about 100 mm. The outlet filter 40 is formed of an alumina ceramic porous plate which has a thickness of about 2 mm. As shown in FIG. 3, the porous plate constituting the outlet filter 40 has a multi-layer structure consisting of a supporting layer 47, an intermediate layer 48 and a filtering layer 49 arranged in this order from the outside. The average pore diameters of the supporting, intermediate and filtering layers 47, 48 and 49 are about 10 μm, about 1 μm and about 0.2 μm, respectively. The thicknesses of the supporting, intermediate and filtering layers 47, 48 and 49 are about 2 mm, from 20 μm to 30 μm and from 20 μm to 30 μm, respectively. When the outlet filter 40 is manufactured, the supporting layer 47, the thickest one, is sintered at first to form a hollow cylinder, and then a raw material of the intermediate layer 48 is applied to the inner surface of the cylinder and sintered, and then a raw material of the filtering layer 49 is further applied to the inner surface of the cylinder and sintered.

End plates 42 made of stainless (SUS316L) are fixed to both ends of the cylinder 45, with a gasket, i.e. a seal member 41 made of Teflon interposed between the end plates 42 and the ends of the cylinder 45. Thus, the ends of the cylinder 45 are airtightly closed, and a gas storing section 46 is formed within the cylinder 45. A pipe 43 formed of stainless is inserted into the cylinder 45 through a through hole of one of the end plates 42. One end of the pipe 43 is connected to the gas introduction pipe 31 outside the cylinder 45, and the other end of the pipe 43 is closed.

About twenty-four holes 44 each of which has a diameter of approximately 2 mm are formed in that portion of the pipe 43 which is situated in the cylinder 45. Specifically, six holes 44 are formed in the periphery of the pipe 43 at intervals along each of the four axes which are located at intervals of 90°. The holes 44 which are formed along the adjacent axes are arranged in a staggered manner.

The gas supplying head 32 is assembled in the following manner:

The cylinder 45, end plates 42 and seal members 41 are positioned side by side, as shown in FIG. 2. Then, the end of the pipe 43 is put through the through hole of one of the end plates 42, and then fixed to the other end plate 42 by welding. Then, the pipe 43 is fixed to said one of the end plates 42 by welding while said one of the end plates 42 pushed toward said other end plate 42, such that the through hole of said one of the end plates 42 is airtightly closed. In addition, a corrosion-prevention process may be performed, wherein, for example, a metal portion of the end plates 42, the pipe 43 or the like is coated with ceramic by flame coating, in order to prevent the metal portion thereof from being corroded.

In the gas supplying head 32, as shown in FIG. 4A, the cylinder 45 is arranged substantially in a central upper region within the load lock chamber 21 such that a gap is sufficiently provided between the cylinder 45 and the upper inner surface of the load lock chamber 21. When the transfer arm 27 supports a wafer W in the load lock chamber 21, as shown in FIG. 4B, the cylinder 45 is arranged substantially coaxially relative to the wafer W. Furthermore, in this case, the axis of the cylinder 45 is parallel to that surface of the wafer W which is to be processed. Therefore, the porous plate of the cylinder 45 is arranged such that it is symmetrical with respect to a plane vertically extends through the axis of the cylinder 45 to the surface to be processed, of the wafer W.

In the gas supplying head 32 having the above structure, gas flows from the holes 44 of the pipe 43 into the gas storing section 46, when the gas is supplied from the gas introduction pipe 31 into the pipe 43. Then, the gas uniformly flows from the entire surface of the cylinder 45 through the pores of the outlet filter 40 in all directions over 360°. Thus, the flow velocity of gas can be decreased relative to the flow rate thereof. Further, the gas flows over the surface of the wafer W supported by the transfer arm 27 as if to seep the surface with a broom, since it flows into the load lock chamber in a laminar fashion and in all directions over 360°. As a result, particles are prevented from flying upward. If they should fly, they are prevented from falling on the surface of the wafer W.

Furthermore, the gas supplying head 32 of this embodiment is designed to eliminate 99.9999% of particles included in the introduced gas, each having a diameter of 0.01 μm or more, in addition to preventing particles from flying. If the diameter of each pore of the outlet filter 40 were decreased, in order to eliminate such fine particles only by filtration, the pressure loss would excessively increase. In the present invention, the outlet filter 40 has en electrostatic attraction function, in addition to a filtration function, and thus can eliminate fine particles due to both the electrostatic attraction function and the filtration function. For example, since the the average pore diameter of the filtering layer 49 of this embodiment is approximately 0.2 μm, particles whose diameters are smaller than this average pore diameter are attracted onto the inner surface of the cylinder 45 by the electrostatic attraction function of the outlet filter 40.

As described above, the porous plate constituting the outlet filter 40 has the multi-layer structure consisting of the supporting, intermediate and filtering layers 47, 48 and 49. As a result, it is possible to decrease the thickness of the filtering layer 49, which has the smallest average pore diameter, down to a small value of from 30 μm to 20 μm, so that a high filtration function is attained without a pressure loss increased. The intermediate layer 48 arranged between the supporting and filtering layers 47 and 49 prevents ceramic particles forming the filtering layer 49 from being embedded among ceramic particles forming the supporting layer 47. Since the supporting layer 47 is located on the outer side of the cylinder 45, the filtering layer 49, the main part, cannot be damaged while the outlet filter 40 is handled.

It is preferable that the porous plate of which the outlet filter 40 is formed should be made of a ceramic sintered compact such as alumina, silicon nitride, silicon carbide or quartz glass or a metal sintered compact such as aluminum alloy, in view of the electrostatic attraction, the mechanical strength, the corrosion resistance, and the heat resistance, etc. of the outlet filter 40. In particular, in the case of using alumina, it is desirable that the alumina should have purity of 99%. Note that the supporting, intermediate and filtering layers 47, 48 and 49 are preferably made of the same material, as in this embodiment, but they may be made of different materials. In this case, the filtering layer 49, the main part, should be made a material selected from the materials set out above.

In view of the capacity and mechanical strength, etc. of the cylinder 45, the thickness of the porous plate of the outlet filter 40 should fall within a range of from 1.5 mm to 5 mm. The porosity of each of the layers 47, 48 and 49 of the outlet filter 40 should fall within a range of from 10% to 50%. If the porosity is greater than 50%, the mechanical strength of the cylinder 45 lowers. On the other hand, if the porosity is smaller than 10%, the pressure loss increases, and the flow rate of gas decreases.

The average pore diameter of the filtering layer 49 should fall within a range of from 0.8 μm to 0.1 μm. If the average pore diameter of the filtering layer 49 is greater than 0.8 μm, particles in the gas cannot be sufficiently eliminated, and the gas flowing from the cylinder 45 is hard to become laminar. On the other hand, if the average pore diameter is smaller than 0.1 μm, the pressure loss increases, and the gas flow rate decreases. Moreover, in view of the pressure loss, the thickness of the filtering layer 49 should be less than 100 μm.

In the case where the porous plate of the outlet filter 40 is formed in such a manner as to satisfy the above desirable conditions, and enable a gas to flow at a flow rate of e.g. from 10 l/min to 100 l/min, the area of the outer periphery of the porous plate (effective gas-flow surface area thereof) should be 750 mm$^2$ or more, preferably 1500 mm$^2$ or more. In view of this regard and the dimensions of the load lock chamber, it is preferable that the outer diameter of the cylinder 45 be from 10 mm to 30 mm, the length thereof be from 50 mm to 300 mm, more preferably from 50 mm to 100 mm.

FIGS. 5 and 6 illustrates results of experiments carried out with respect to the effects which the gas supplying head 32 has, using the load lock chamber 21 explained with reference to FIGS. 1 to 4.

In the experiment the result of which is shown in FIG. 5, the number of particles in the load lock chamber 21 was counted both before the wafer W was transferred into the load lock chamber 21, and after the wafer W was transferred into and then out of the load lock chamber 21. While storing the wafer W, the load lock chamber 21 was exhausted and was then restored to the regular inner pressure. The difference between the number of particles counted before the treatment of the wafer W and that counted after the treatment of the wafer W was determined. In the experiment, the time required to restore the inner pressure of the load lock chamber 21 from a vacuum to the regular pressure was set at 30 seconds, and only particles each having a diameter of 0.2 μm or more were counted.

In FIG. 5, test numbers 1 to 9 are plotted against the abscissa, and the number of particles each having a diameter of 0.2 μm or more and adhering to a wafer W having a diameter of 6 in. (inches) is plotted against the ordinate. Lines A, B, C and D represent results of examples A, B, C and D, respectively. In the example A, no gas supplying head 32 was provided, and a gas was introduced directly from the gas introduction pipe 31 into the load lock chamber 21. In the example B, there was provided a gas supplying head 32 having the ceramic filter cylinder 45, which had an outer diameter of 19 mm and a length of 100 mm. Namely, the outlet filter 40 of this cylinder 45 had the multi-layer structure shown in FIG. 3, the filtering layer 47 of which had a average pore diameter of 0.2 μm. In the example C, there was provided a gas supplying head 32 having a filter cylinder 45, which was made of a stainless sintered compact and had an outer diameter of 19 mm, a length of 75 mm, and fine pores having an average diameter of 3 μm. In the example D, there was provided no gas supplying head 32, but a filter, which was made of a stainless sintered compact and had a diameter of 150 mm and pores having an average diameter of 1 μm, was attached to the open end of the gas introduction pipe 31.

As shown in FIG. 5, in the example A, about one thousand particles adhered to the wafer W. On the other hand, in the examples B, C and D, several to a multiplication of ten particles (e.g. 5 to 50) adhered to the wafer W. In particular, from these examples, the example B was the smallest with respect to the number of particles adhering to the wafer W.

The experiment, the result of which is shown in FIG. 6, was intended to examine the relationship between the number of particles adhering to the wafer W and the location of the gas supplying head 32. The experiment was carried out using the gas supplying head 32 having the same ceramic filter cylinder 45 as in the above example B. The method of the experiment wa the same as that of the experiment the result of which is shown in FIG. 5.

In FIG. 6, the abscissa is used as test numbers 1 to 9, and the ordinate is used as the number of particles each having a diameter of 0.2 μm or more and adhering to a wafer W having a diameter of 6 in. Lines E, F, and G represent results obtained in the cases where, as roughly shown in FIG. 7, the gas supplying head 32 was situated at a location E (above the wafer W), at a location F (adjacent to the wafer W), and at a location G (below the wafer W), respectively.

As illustrated in FIG. 6, the example E was better than any other example, i.e. each of the examples F and G. In other words, it was the most preferable that the gas supplying head 32 be situated above the wafer W. In the example E, the average number of particles adhering on the wafer W was about three, i.e. the smallest number from those of all the examples.

This appears to be caused by the following:

When the gas supplying head 32 is situated above the wafer W, gas supplied from the gas supplying head 32 flows against the wafer W, and then becomes a gas stream and flows toward a bottom portion, etc. of the load lock chamber 21. Therefore, even if particles fly, they do not adhere to the wafer W.

However, the gas supplying head 32 may be situated adjacent to the wafer W or below the wafer W, if it cannot be situated above the wafer W in view of the design of the load lock chamber 21. Even if the gas supplying head 32 is situated adjacent to the wafer W or below the wafer W, the number of adhering particles (thereon) is reduced to 1/10 or less of those in conventional systems.

Further, an experiment was carried out, where a mesh filter having larger mesh holes was attached to the open end of the gas introduction pipe 31. In this experiment, the mesh filter was made of metal or resin such as Teflon, and had 20 to 30 meshes (each mesh holes is about 1 mm square). In the load lock chamber adopting such a mesh filter, the following problems have been found out:

First, the mesh size is excessively great, and thus the filter cannot sufficiently restrict rapid variation of the inner pressure of the load lock chamber.

Second, if a corrosive gas is used in the processing chamber, it is difficult to perfectly prevent the corrosive gas from being diffused from the processing chamber into the load lock chamber. Thus, metal parts of the filter, such as the filter itself, and fittings, e.g. screws, etc. are easily corroded by the corrosive gas.

Third, the filter is provided on the open end of the gas introduction pipe, and thus increases the pressure loss. Therefore, it takes much time to adjust the inner pressure of the load lock chamber, for example, in the case of restoring the inner pressure to an atmospheric pressure.

Fourth, the mechanical strengths of the filter and an attachment portion thereof are not enough to bear a great pressure difference between the both sides of the filter. In other words, since the valve cannot be slowly opened, there is a limit to a decreasing degree in variation of the inner pressure of the load lock chamber.

FIG. 8 is a schematic view showing a load lock chamber 51 in which a gas supplying head 32 is provided, according to another embodiment.

The load lock chamber 51 shown in FIG. 8 includes a rack 55, and the gas supplying head 32 is arranged above the rack 55. When a wafer W having a diameter of 6 in. is placed on the rack 55, the positional relationship between the gas supplying head 32 and the wafer W is the same as that between the gas supplying head 32 and wafer W shown FIG. 4B. A gas introduction pipe 52 is connected to a pipe 43 of the gas supplying head 32 through a valve V1. An exhaustion pipe 53 is connected to the load lock chamber 51, and a valve V2 is provided on the exhaustion pipe 53. A fine-adjustment valve V3 is provided on the exhaustion pipe 53 in such a manner as to bypass the valve V2. Further, there is provided a pressure gauge 54 for measuring the inner pressure of the load lock chamber 51.

Tables 1 to 3 show results of experiments carried out with respect to effects which the gas supplying head 32 has, using the load lock chamber 51.

Specifically, in an example 1, the load lock chamber 51 was provided with a gas supplying head 32 having the ceramic filter cylinder 45, which had an outer diameter of 19 mm and a length of 100 mm. Namely, the outlet filter 40 of this cylinder 45 had the multi-layer structure shown in FIG. 3, the filtering layer 47 of which had a average pore diameter of 0.2 μm. A wafer W having a diameter of 6 in. was set on the rack 55, and the inner pressure of the load lock chamber 51 was decreased to 5×10$^{-2}$ Torr. A high-purity nitrogen gas was supplied into the gas supplying head 32, and then supplied therefrom into the load lock chamber 51, such that the flow rate of the gas was constant, thereby increasing the inner pressure thereof to the atmospheric pressure. The relationship established at this time between the pressure of the inside of the load lock chamber 51 and the flow rate of the gas is shown in FIG. 9. Next, the wafer W was moved out of the load lock chamber 51, and the number of particles adhering to the surface of the wafer W was counted, and the diameters of the particles were measured, by a wafer-surface defect inspecting device. The above-mentioned test was carried out three times, thereby obtaining the average number of adhering particles and the average diameter thereof.

In each of examples 2 to 4, the test was tried three times under conditions which were the same as those in the example 1, except that the examples 2 to 4 used ceramic filter cylinders 45 which had a length of 50 mm, a length of 200 mm, and a length of 300 mm, respectively. Further, in the examples 2 to 4, only the total number of particles was counted.

In a comparison example 1, the above test was made three times under conditions which were the same as those in the example 1, except that no gas supplying head 32 was provided, i.e. gas was introduced directly from an end portion of the gas introduction pipe 52 into the load lock chamber 52. In a comparison example 2, the test was carried out three times under conditions which were the same as those in the example 1, except that there was provided a metal filter cylinder having a length of 100 mm and an average pore diameter of 3 μm. Further, in the comparison examples 1 and 2, only the total number of particles was counted.

The result of the test carried out in each of the examples 1 to 4 and the comparison examples 1 and 2 is illustrated by the following table 1:

TABLE 1

|  |  | Example | | | | Comparison Example | |
| --- | --- | --- | --- | --- | --- | --- | --- |
|  |  | 1 | 2 | 3 | 4 | 1 | 2 |
| Particle Diameter (μm) | 0.2 to 0.3 | 0.7 | — | — | — | — | 12.0 |
|  | 0.3 to 0.5 | — | 0.3 | — | — | 15.7 | — |
|  | 0.5 or more | 2.0 | — | — | — | — | 37.8 |
| Total Number |  | 3.0 | 8.0 | 2.5 | 2.0 | 2411.7 | 65.0 |

In an example 5, the load lock chamber 51 was provided with a gas supplying head 32 having the ceramic filter cylinder 45, which had an outer diameter of 19 mm and a length of 100 mm. Namely, the outlet filter 40 of this cylinder 45 had the multi-layer structure shown in FIG. 3, the filtering layer 47 of which had a average pore diameter of 0.2 μm. The aforementioned test was carried out under conditions which were the same as those in the example 1, except that a high-purity nitrogen gas was supplied such that the flow speed was constant. The number of particles and the diameter of each particle were measured by the wafer-surface defect inspecting device. The relationship established at this time between the pressure of the inside of the load lock chamber 51 and the flow rate of the gas is illustrated in FIG. 10. The above test was made three times, thereby obtaining average values.

In each of examples 6 to 8, the test was tried three times under conditions which were the same as those in the example 5, except that the examples 6 to 8 used ceramic filter cylinders 45 which had a length of 50 mm, a length of 200 mm, and a length of 300 mm, respectively. Further, in the examples 6 to 8, only the total number of particles was counted.

In a comparison example 3, the above test was made three times under conditions which were the same as those in the example 5, except that no gas supplying head 32 was provided, i.e. gas was introduced directly from an end portion of the gas introduction pipe 52 into the load lock chamber 52. In a comparison example 4, the test was carried out three times under conditions which were the same as those in the example 5, except that there was provided a metal filter cylinder having a length of 100 mm and an average pore diameter of 3 μm. Further, in the comparison examples 3 and 4, only the total number of particles was counted.

The result of the test carried out in each of the examples 5 to 8 and the comparison examples 3 and 4 is illustrated by the following table 2:

TABLE 2

|  |  | Example | | | | Comparison Example | |
| --- | --- | --- | --- | --- | --- | --- | --- |
|  |  | 5 | 6 | 7 | 8 | 3 | 4 |
| Particle Diameter (μm) | 0.2 to 0.3 | 1.3 | — | — | — | — | 15.0 |
|  | 0.3 to 0.5 | 0.3 | — | — | — | — | 18.0 |
|  | 0.5 or more | 3.7 | — | — | — | — | 56.7 |
| Total Number |  | 5.3 | 12.0 | 5.3 | 2.7 | 696.7 | 99.7 |

Figure 11:
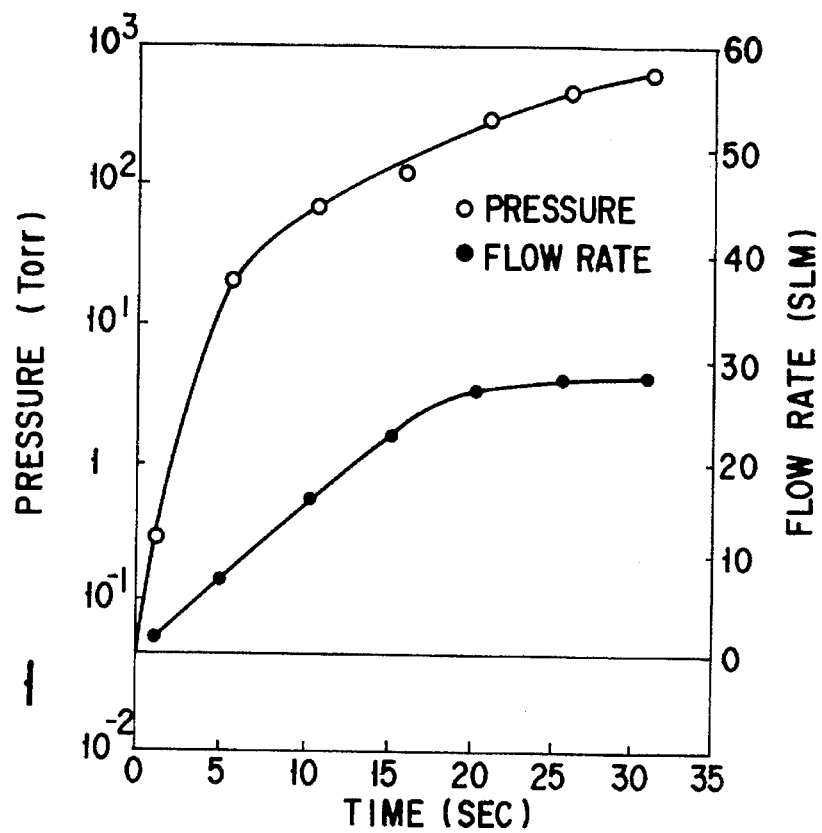
FIG. 11 is a graph showing the relationship between the inner pressure of the gas flow rate of the load lock chamber shown in FIG. 8 in a further experiment carried out by use of the load lock chamber.

In an example 9, the load lock chamber 51 was provided with a gas supplying head 32 having the ceramic filter cylinder 45, which had an outer diameter of 19 mm and a length of 100 mm. Namely, the outlet filter 40 of this cylinder 45 had the multi-layer structure shown in FIG. 3, the filtering layer 47 of which had a average pore diameter of 0.2 μm. The aforementioned test was carried out under conditions which were the same as those in the example 1, except that a high-purity nitrogen gas was supplied such that the flow rate of the gas was increased proportionally to the passage of time from the first period of supply of the gas to the middle period thereof. The number of particles and the diameter of each particle were measured by the wafer-surface defect inspecting device. The relationship established at this time between the pressure of the inside of the load lock chamber 51 and the flow rate of the gas is illustrated in FIG. 11. The above test was made three times, thereby obtaining average values.

In each of examples 10 to 12, the test was tried three times under conditions which were the same as those in the example 9, except that the examples 10 to 12 used ceramic filter cylinders 45 which had a length of 50 mm, a length of 200 mm, and a length of 300 mm, respectively. Further, in the examples 10 to 12, only the total number of particles was counted.

In a comparison example 5, the above test was made three times under conditions which were the same as those in the example 9, except that no gas supplying head 32 was provided, i.e. gas was introduced directly from an end portion of the gas introduction pipe 52 into the load lock chamber 52. In a comparison example 6, the test was carried out three times under conditions which were the same as those in the example 9, except that there was provided a metal filter cylinder having a length of 100 mm and an average pore diameter of 3 μm. Further, in the comparison examples 5 and 6, only the total number of particles was counted.

The result of the test carried out in each of the examples 9 to 12 and the comparison examples 5 and 6 is illustrated by the following table 3:

TABLE 3

|  |  | Example | | | | Comparison Example | |
| --- | --- | --- | --- | --- | --- | --- | --- |
|  |  | 9 | 10 | 11 | 12 | 5 | 6 |
| Particle Diameter (μm) | 0.2 to 0.3 | 3.3 | — | — | — | — | 13.7 |
|  | 0.3 to 0.5 | 1.3 | — | — | — | — | 8.3 |
|  | 0.5 or more | 2.7 | — | — | — | — | 63.3 |
| Total Number |  | 7.3 | 9.3 | 6.7 | 0.7 | 556.3 | 85.3 |

As shown in FIGS. 1 to 3, the number of particles is extremely decreased in the case where the ceramic filter cylinder 45 is used in the gas supplying head 32, as compared with the case of using the metal filter, as well as the case of using no filter. Furthermore, the greater the length of the filter cylinder 45, the smaller the number of particles adhering to the load lock chamber.

Figure 12:
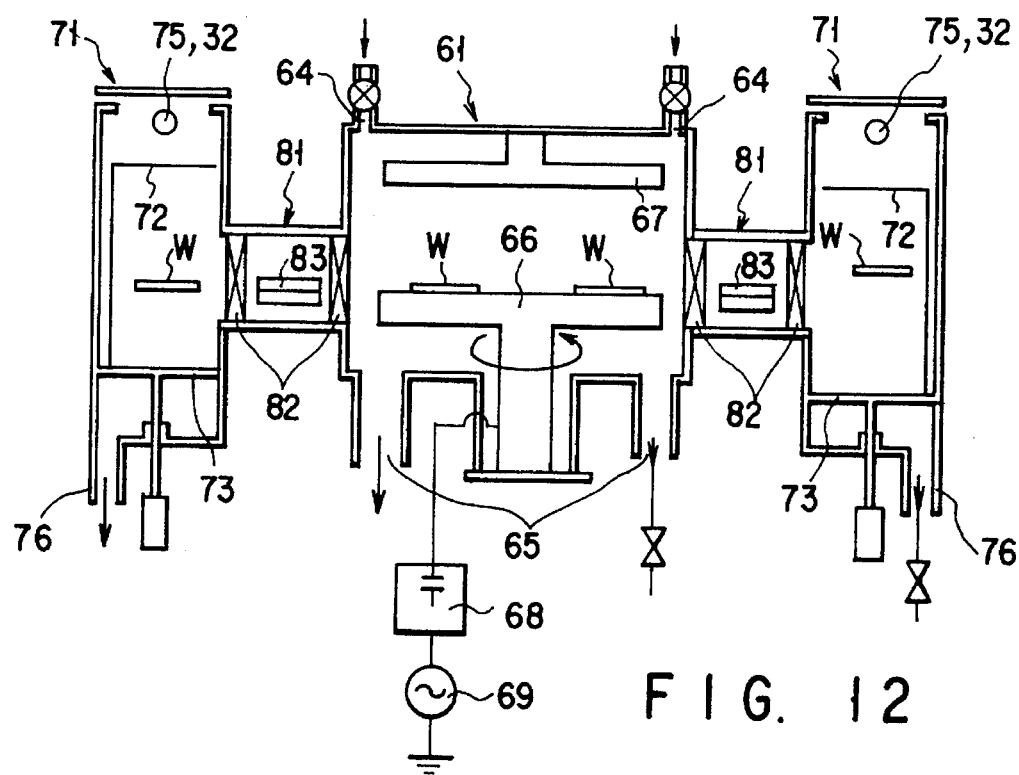
FIG. 12 is a schematic view showing an etching system for etching semiconductor wafers by use of a load lock chamber according to still another embodiment.

FIG. 12 is a schematic view of an etching system having a load lock chamber, according to still another embodiment, in which a gas supplying head 32 is provided.

The etching system shown in FIG. 12 comprises a processing chamber 61, and two preliminary chambers, i.e. a load lock chamber 71 for holding wafers to be processed and a load lock chamber 71 for holding wafers processed. The processing chamber 61 is connected to the load lock chambers 71 by transfer chambers 81. The chambers 71, 81 and 61 are airtightly connected to each other by valves.

A reaction gas supplying system 64 is connected to an upper portion of the processing chamber 61, and an exhausting system 65 is connected to a lower portion of the processing system 61. In the processing chamber 61, there are provided a susceptor 66 serving as a lower electrode and a table for supporting a plurality of wafers W, and an upper electrode 67 opposite to the susceptor 66. The upper electrode 67 is grounded, and the susceptor 66 is connected to a high-frequency power supply 69 through a matching circuit 68. The susceptor 66 can be rotated during etching of the wafer W.

The load lock chamber 71 includes a rack 72 for storing a plurality of wafers W at intervals in a vertical direction. The rack 72 is driven in the vertical direction by an elevator 73. A gas supplying system 75 for supplying inert gas such as nitrogen or a gas such as air into a region above the rack 72 is connected to an upper portion of the load lock chamber 71, and an exhausting system 76 is connected to a lower portion of the load lock chamber 71. Therefore, the load lock chamber 71 independently adjusts the inner pressure thereof. The gas supplying system 75 of the load lock chamber 71 has a gas introduction pipe which airtightly penetrates the casing of the load lock chamber 71, and which is connected to a gas supplying source. The gas supplying head 32 is connected to an end of the gas introduction pipe.

A transfer arm 83 for carrying the wafer W is arranged in the transfer chamber 81, and a gas supplying system and an exhausting system are connected to the transfer chamber 81 also. However, no gas supplying head 32 is provided in the transfer chamber 81, since gas is not supplied into the transfer chamber 81 at a regular operation time.

As mentioned above, the load lock chamber 71 of the etching system shown in FIG. 12 stores a plurality of wafers W at a time, unlike the load lock chambers 21 and 51 shown in FIGS. 1 and 8, each of which stores only one wafer W at a time. In the load lock chamber 31, the gas supplying head 32 have the same advantages as in the lock chambers 21 and 51.

The porous plate of the gas supplying head, which serves as an outlet for gas, can be formed in various shapes, i.e. the shape of the porous plate is not limited to cylinder.

Figure 13:
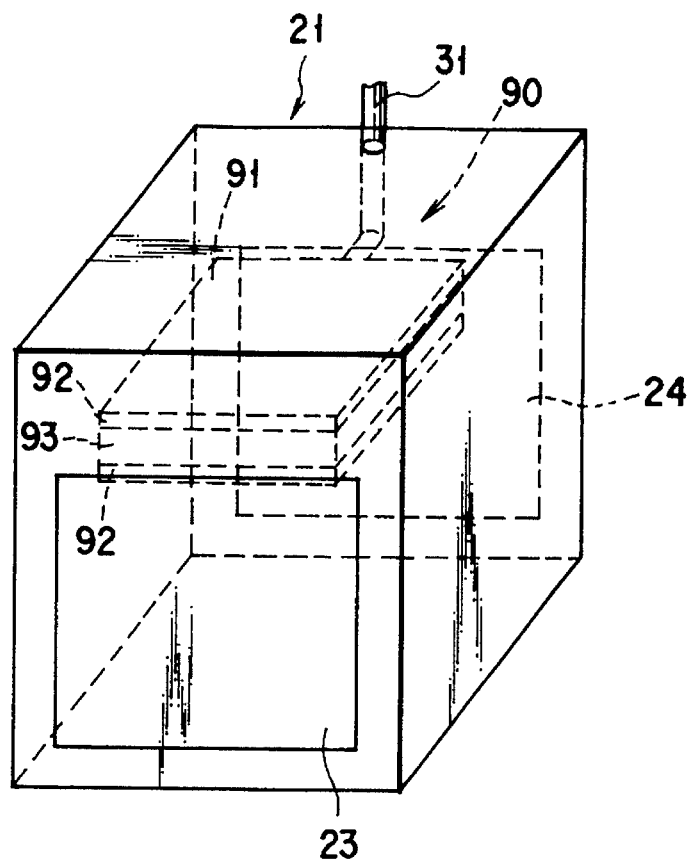
FIG. 13 is a schematic perspective view showing the load lock chamber according to still another embodiment.

For example, a gas supplying head 90 shown in FIG. 13 includes an outlet filter 91 formed in a rectangular box. More specifically, in the outlet filter 91, a pair of porous ceramic plates 92, i.e. upper and lower porous ceramic plates 92 having the multi-layer structure shown in FIG. 3 are provided at a distance, with a seal material interposed therebetween, in such a manner as to provide a gas storing section. The upper and lower porous ceramic plates 92 are arranged in parallel with the wafer W, and a space is sufficiently provided between the upper porous ceramic plate 92 and the upper inner surface of the load lock chamber 21.

Figure 14:
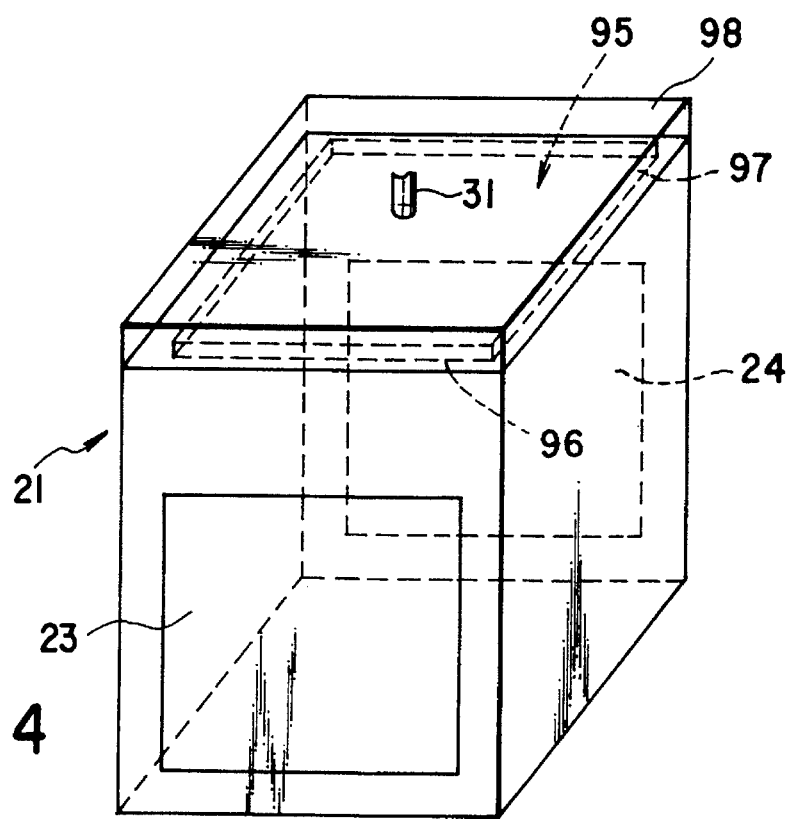
FIG. 14 is a schematic perspective view showing the load lock chamber according to still another embodiment.

An outlet filter 96 of a gas supplying head 95 shown in FIG. 14 comprises a porous ceramic plate 97 having the multi-layer structure shown in FIG. 3 and constituting substantially the entire of the upper inner surface of a load lock chamber 21. An auxiliary chamber 98 for forming a gas storing section is provided on the top surface of the ceramic plate 97.

Furthermore, an outlet filter can be semicylindrically formed such that the lower half of a filter cylinder is formed in the same manner as the lower half of the filter cylinder 45 shown in FIG. 2, and the upper half of the filter cylinder is flatly shaped. In either case, that part of the outlet filter which is opposite to the surface to be processed, of the wafer W, is arranged parallel thereto and a gas supplied therefrom flows in a laminar fashion against the surface of the wafer W at substantially 90° relative thereto.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A gas supplying head for supplying a gas for use in pressure adjustment into an airtight casing of a semiconductor processing system while a substrate to be processed is supported within an inside of said casing, the gas supplying head comprising:

a gas storing section which communicates with a gas introduction pipe for introducing the gas into said casing; and an outlet filter comprising a porous filtering layer having a number of pores through which said gas storing section communicates with said inside of the casing, said pores having a average diameter of from 0.8 μm to 0.1 μm, said filtering layer having porosity of from 10% to 50%.

2. The gas supplying head according to claim 1, wherein said filtering layer is made of a material which has a filtration function and an electrostatic attraction function, thereby eliminating particles from the gas to be supplied into said casing.

3. The gas supplying head according to claim 2, wherein said filtering layer is formed of a porous ceramic layer.

4. The gas supplying head according to claim 3, wherein said outlet filter has a multi-layer structure comprising said filtering layer and a supporting layer formed of a porous ceramic layer, which has a number of pores having a average diameter substantially greater than that of said filtering layer.

5. The gas supplying head according to claim 4, wherein each of said filtering and supporting layers is made of a sintered compact of a material selected from a group consisting of alumina, silicon nitride, silicon carbide, and quartz glass.

6. The gas supplying head according to claim 4, wherein said filtering layer has a thickness of less than 100 μm.

7. The gas supplying head according to claim 4, wherein the gas is supplied from said outlet filter in a substantial laminar fashion.

8. The gas supplying head according to claim 4, wherein said outlet filter is formed into a hollow cylinder defining said gas storing section, and the gas is supplied from the outlet filter in all directions over 360°.

9. The gas supplying head according to claim 4, wherein said outlet filter is formed into a hollow rectangular box defining said gas storing section.

10. The gas supplying head according to claim 4, wherein said outlet filter constitutes a part of an inner surface of said casing.

11. A load lock chamber of a semiconductor processing system for processing a substrate, comprising:

an airtight casing which has an opening for allowing the substrate to pass therethrough;

closing means for openably and airtightly closing said opening;

supporting means for supporting the substrate within an inside of said casing;

a gas introduction pipe for introducing a gas for use in pressure adjustment into said casing;

an exhausting system for exhausting said casing; and a gas supplying head connected to said gas introduction pipe, for supplying the gas introduced from said gas introduction pipe into said casing while the substrate is supported by said supporting means, wherein said gas supplying head comprises a gas storing section communicating with said gas introduction pipe, and an outlet filter comprising a porous filtering layer having a number of pores through which said gas storing section communicates with said inside of the casing, said pores having a average diameter of from 0.8 μm to 0.1 μm, said filtering layer having porosity of from 10% to 50%.

12. The load lock chamber according to claim 11, wherein said filtering layer is made of a material which has a filtration function and an electrostatic attraction function, thereby eliminating particles from the gas to be supplied into said casing.

13. The load lock chamber according to claim 12, wherein said filtering layer is formed of a porous ceramic layer.

14. The load lock chamber according to claim 13, wherein said outlet filter has a multi-layer structure comprising said filtering layer and a supporting layer formed of a porous ceramic layer, which has a number of pores having a average diameter substantially greater than that of said filtering layer.

15. The load lock chamber according to claim 14, wherein each of said filtering and supporting layers is made of a sintered compact of a material selected from a group consisting of alumina, silicon nitride, silicon carbide, and quartz glass.

16. The load lock chamber according to claim 14, wherein said filtering layer has a thickness of less than 100 μm.

17. The load lock chamber according to claim 14, wherein the gas is supplied from said outlet filter in a substantial laminar fashion.

18. The load lock chamber according to claim 14, wherein said outlet filter is formed into a hollow cylinder defining said gas storing section, and the gas is supplied from the outlet filter in all directions over 360°.

19. The load lock chamber according to claim 14, wherein said outlet filter is formed into a hollow rectangular box defining said gas storing section.

20. The load lock chamber according to claim 14, wherein said outlet filter constitutes a part of an inner surface of said casing.

21. The load lock chamber according to claim 14, wherein said outlet filter is arranged above the substrate supported by said supporting means.

* * * * *